(12) United States Patent
Ueno

(10) Patent No.: US 7,724,045 B2
(45) Date of Patent: May 25, 2010

(54) OUTPUT BUFFER CIRCUIT

(75) Inventor: Masaji Ueno, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/211,841

(22) Filed: Sep. 17, 2008

(65) Prior Publication Data
US 2009/0085639 A1 Apr. 2, 2009

(30) Foreign Application Priority Data
Sep. 28, 2007 (JP) ............................. 2007-253332

(51) Int. Cl.
*H03B 1/00* (2006.01)
(52) U.S. Cl. ........................................ 327/108; 326/83
(58) Field of Classification Search .................. 326/82, 326/83; 327/108–112
See application file for complete search history.

(56) References Cited

U.S. PATENT DOCUMENTS

| | | | |
|---|---|---|---|
| 6,501,306 B1 * | 12/2002 | Kim et al. | 327/112 |
| 6,600,348 B1 * | 7/2003 | Yu et al. | 327/112 |
| 6,720,802 B2 * | 4/2004 | Cho | 327/108 |
| 7,005,897 B2 * | 2/2006 | Lim | 327/112 |
| 7,046,067 B2 * | 5/2006 | Chung | 327/333 |
| 7,068,083 B2 * | 6/2006 | Kim et al. | 327/108 |
| 7,215,146 B2 * | 5/2007 | Khan | 326/83 |
| 7,456,663 B2 * | 11/2008 | Lim | 327/112 |
| 2003/0080780 A1 * | 5/2003 | Okamoto et al. | 326/83 |
| 2003/0107414 A1 * | 6/2003 | Cho | 327/108 |
| 2007/0159218 A1 * | 7/2007 | Srinivas et al. | 327/108 |

FOREIGN PATENT DOCUMENTS

JP 2004-227753 8/2004

* cited by examiner

*Primary Examiner*—Lincoln Donovan
*Assistant Examiner*—William Hernandez
(74) *Attorney, Agent, or Firm*—Turocy & Watson, LLP

(57) ABSTRACT

An output buffer circuit is provided that outputs an input signal output from a circuit operating at a first power supply voltage to another circuit operating at a second power supply voltage higher than the first power supply voltage. The output buffer circuit includes an output driver circuit including a pull-up transistor and a pull-down transistor connected between the second power supply voltage and a reference voltage. A first driving circuit outputs a first control signal to control the pull-down transistor. A second driving circuit includes a latch circuit to latch signals and outputs a second control signal to control the pull-up transistor based on retained data in that latch circuit. A level shifter changes the retained data in the latch circuit when logic of the input signal changes.

13 Claims, 4 Drawing Sheets

F I G. 1
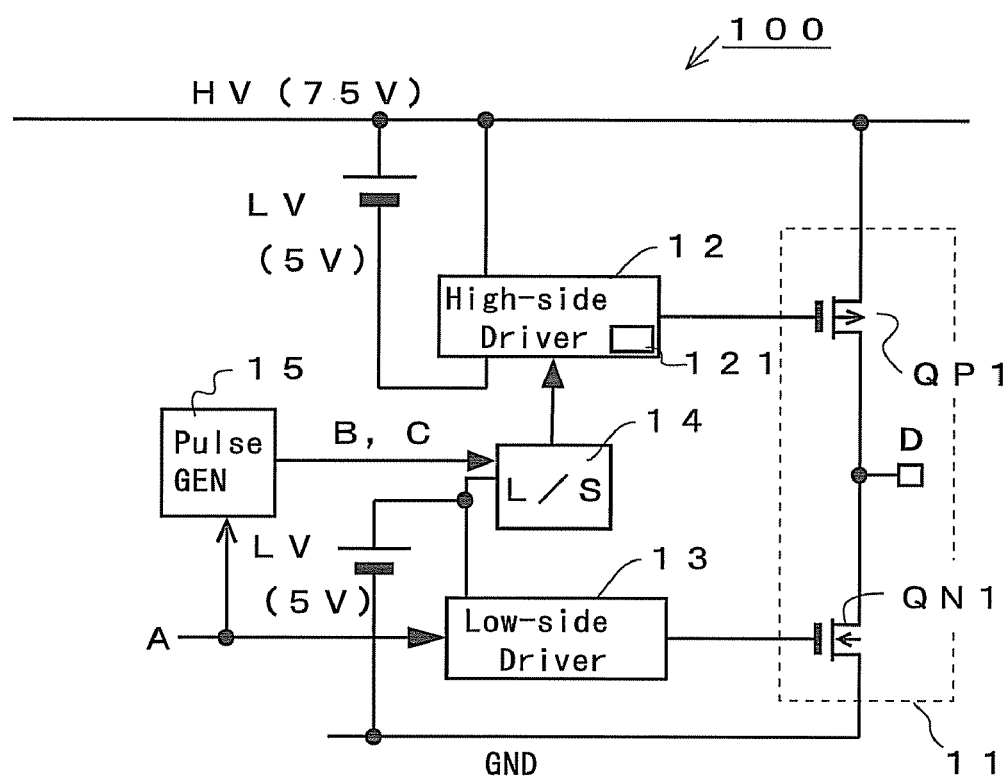

US 7,724,045 B2

OUTPUT BUFFER CIRCUIT

CROSS REFERENCE TO RELATED APPLICATIONS

This application is based on and claims the benefit of priority from prior Japanese Patent Application No. 2007-253332, filed on Sep. 28, 2007, the entire contents of which are incorporated herein by reference.

BACKGROUND OF THE INVENTION

1. Field of the Invention

The present invention relates to an output buffer circuit, and in particular, to a high voltage output buffer circuit that is connected between a low-breakdown-voltage circuit and a high voltage circuit in order to input an output signal from a low-breakdown-voltage circuit to a high-voltage circuit operating at a high voltage.

2. Description of the Related Art

Output buffer circuits are used to transfer low-voltage control signals to high-voltage circuits operating at a high voltage, where a pull-up transistor and a pull-down transistor are connected in series (totem-pole connection) (see, for example, Japanese Patent Laid-Open No. 2004-227753). In this case, while the pull-down transistor may be directly driven by a low-voltage control signal, controlling the pull-up transistor requires increasing the voltage of a low-voltage control signal with a level shifter before inputting.

The output buffer circuit of this type involves a large amount of gate-to-drain parasitic capacitance in the pull-up transistor, which would lead to difficulties in increasing switching rate while reducing the associated power consumption.

SUMMARY OF THE INVENTION

One aspect of the present invention provides an output buffer circuit outputting an input signal output from a circuit operating at a first power supply voltage to another circuit operating at a second power supply voltage higher than the first power supply voltage, the output buffer circuit comprising: an output driver circuit including a pull-up transistor and a pull-down transistor connected between the second power supply voltage and a reference voltage; a first driving circuit outputting a first control signal to control the pull-down transistor; a second driving circuit including a latch circuit to latch signals, and outputting a second control signal to control the pull-up transistor based on retained data in that latch circuit; and a level shifter changing the retained data in the latch circuit when logic of the input signal changes.

BRIEF DESCRIPTION OF THE DRAWINGS

FIG. 1 is a circuit diagram illustrating a configuration of an output buffer circuit according to a first embodiment of the present invention;

DETAILED DESCRIPTION OF THE EMBODIMENTS

Figure 2:
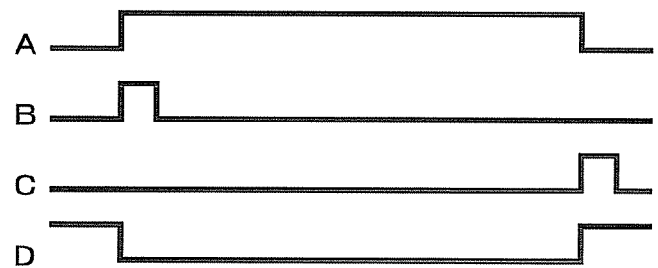
FIG. 2 is a timing chart illustrating operation of the first embodiment.

Embodiments of the present invention will now be described in detail below with reference to the accompanying drawings.

First Embodiment

FIG. 1 illustrates a configuration of an output buffer circuit 100 according to a first embodiment of the present invention. The output buffer circuit 100 comprises an output driver circuit 11, a high-side driving circuit 12, a low-side driving circuit 13, a level shifter 14, and a pulse generation circuit 15.

The output buffer circuit 100 outputs a 5V-type input signal A as a 75V-type output signal D, as will be apparent from the following description. Clearly, such values of "5V" and "75V" are only illustrative examples and not intended to limit the scope of the present invention.

The output driver circuit 11 is configured to have a p-type MOS transistor QP1 and an n-type MOS transistor QN1 connected in series between a second power supply voltage (HV: 75V) and a ground voltage GND. A 75V-type output signal D is output to the subsequent stage high voltage circuit (not illustrated) from an output terminal, which is a connection node of both transistors QP1 and QN1.

In addition, the gate of the p-type MOS transistor QP1 is connected to the high-side driving circuit 12. The high-side driving circuit 12 is driven by a third first power supply voltage (LV: 5V) with the second power supply voltage (HV: 75V) as a reference. The high-side driving circuit 12, which includes a latch circuit 121 to latch signals, switches conductivity of the p-type MOS transistor QP1 according to retained data in the latch circuit 121. The low-side driving circuit 13 is driven by the first power supply voltage (5V) with the ground voltage GND as a reference and may be configured by an inverter circuit as with conventional circuits.

The level shifter 14 and the pulse generation circuit 15 are provided to switch retained data in the latch circuit 121. The level shifter 14 has the role of inputting pulse signals B and C as illustrated in FIG. 2, each rising at rising and falling edges of an input signal A, respectively, and switching the potential of a data retaining node in the latch circuit 121 based on the pulse signals B and C. The pulse signals B and C are generated by the pulse generation circuit 15 based on the input signal A.

In the output buffer circuit 100 of this embodiment, retained data in the latch circuit 121 is switched by the pulse signals B and C that are input to the level shifter 14. The gate voltage of the pull-up transistor QP1 is switched based on the retained data.

Figure 6:
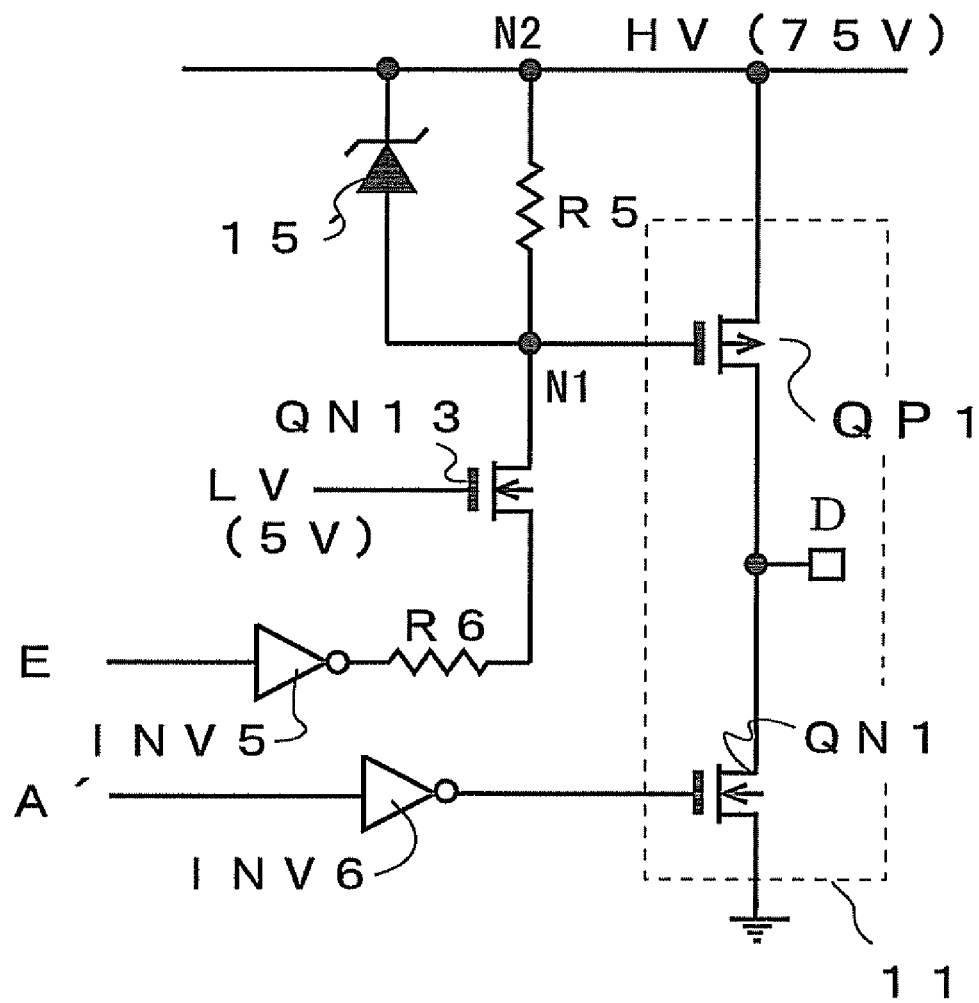
FIG. 6 is a circuit diagram illustrating an example of a conventional output buffer circuit.

For comparison, an example of a conventional output buffer circuit is illustrated in FIG. 6. In this conventional output buffer circuit, a zener diode 15' and a resistor R5 are connected between the gate of the pull-up transistor QP1 and the second power supply voltage (75V). A node N1 at one end of the resistor R5, i.e., the gate of the pull-up transistor QP1 is connected to the n-type MOS transistor QN13. A first power supply voltage B (5V) is applied to the gate of the n-type MOS transistor QN13. The other end of the n-type MOS transistor QN13 is connected via a resistor R6 to an inverter INV5, to which a control signal E is input to control voltage of the node N1. By switching the control signal E between "H" and "L", the amount of voltage drop in the resistor R5 is switched to switch the pull-up transistor QP1 on and off.

In this configuration, however, the larger the resistor R5, the slower will be the switching rate of the pull-up transistor QP1, whereas the smaller the resistor R5, the larger the current consumption. Therefore, it is difficult to achieve high switching rate and small current consumption at the same time.

To this extent, in this embodiment, such problems are solved by performing conductivity control of the pull-up transistor QP1 with the latch circuit 121, which may provide both improved switching rate and smaller current consumption.

Second Embodiment

Figure 3:
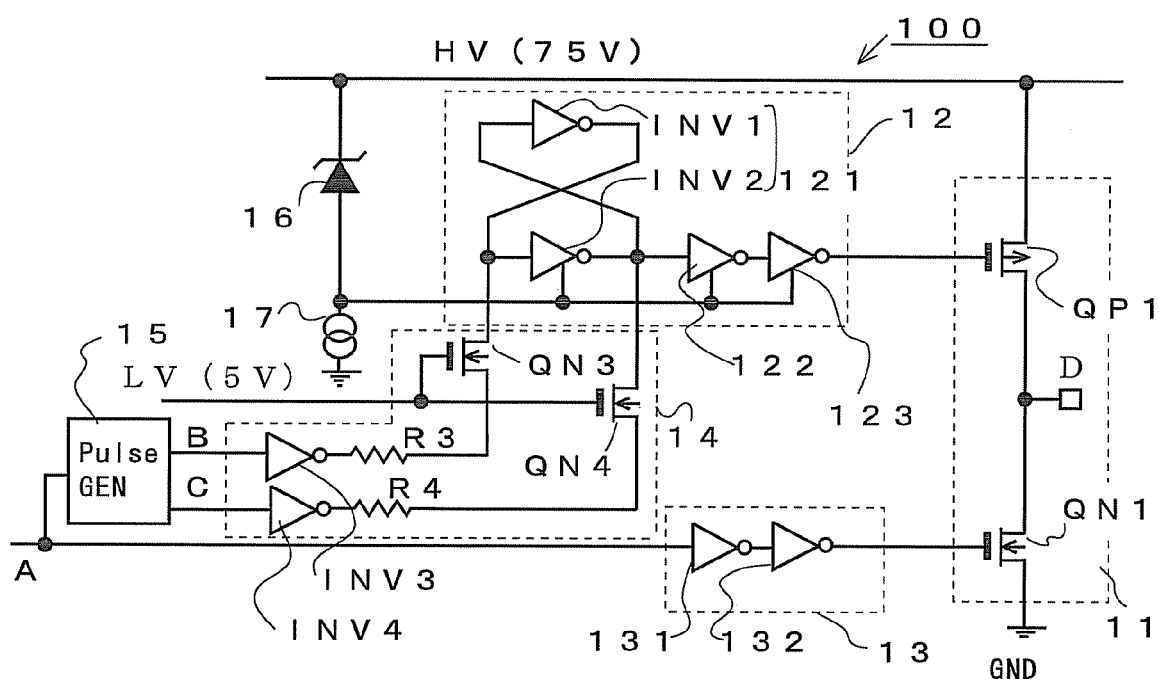
FIG. 3 is a circuit diagram illustrating a configuration of an output buffer circuit according to a second embodiment of the present invention.

Referring now to FIG. 3, description is made to a configuration of an output buffer circuit according to a second embodiment of the present invention. In FIG. 3, the same reference numerals represent the same components as the first embodiment and description thereof will be omitted.

This embodiment has the same basic configuration as the first embodiment, but clarifies the internal configuration of each circuit.

The high-side driving circuit 12 of this embodiment includes inverters 122 and 123 as well as the latch circuit 121 formed by inverters INV1 and INV2 that are cross-coupled to each other. In addition, the low-side driving circuit 13 is configured by inverters 131 and 132 that are connected in series. Input to the inverter 131 is a 5V-type input signal A.

The high-side driving circuit 12 is driven by a voltage generated by a zener diode 16 and a constant current source 17 that are connected in series between the second power supply voltage (75V) and the ground voltage GND. That is, the zener diode 16 generates a voltage (third voltage) resulting from reduction of the second power supply voltage (75V) by a predetermined voltage and functions as a step-down circuit to drive the high-side driving circuit 12 with the second power supply voltage and the third voltage.

The level shifter 14 includes inverters INV3 and INV4, resistors R3 and R4, and n-type MOS transistors QN3 and QN4. Each of the inverters INV3 and INV4 inputs input pulse signals B and C as illustrated in FIG. 2 and outputs the inverted signals. Each of the resistors R3 and R4 has its one end connected to an output terminal of each of the inverters INV3 and INV4. Each of the n-type MOS transistors QN3 and QN4 has its source connected to the other end of each of the resistors R3 and R4 and its drain connected to the data retaining node in the latch circuit 121. In addition, the first power supply voltage (5V) is always supplied to the gates of both transistors QN3 and QN4.

In this configuration, the pulse signals B and C are input to the inverters INV3 and INV4 at a rising or falling edge of input signals A and B, respectively, thereby switching the potential of the data retaining node in the latch circuit 121. The switched potential of the data retaining node is input to the pull-up transistor QP1 as a gate signal, thereby the corresponding output signal D being switched between "H" and "L".

Figure 4:
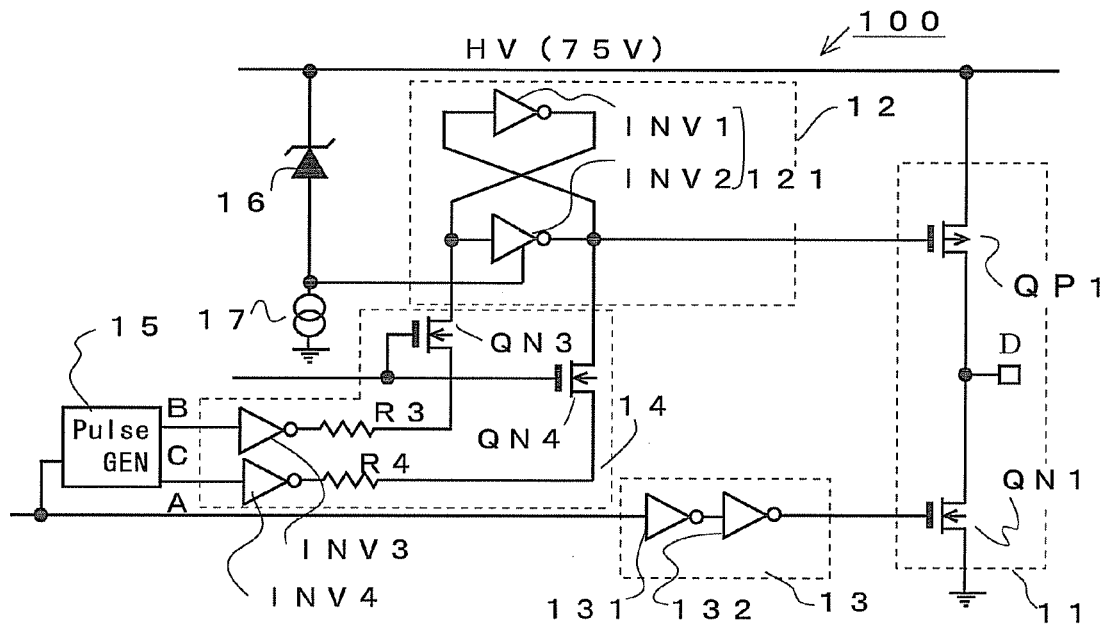
FIG. 4 is a circuit diagram illustrating a variation of the second embodiment of the present invention.

FIG. 4 is a circuit diagram illustrating an output buffer circuit according to a variation of the second embodiment. In this variation, the inverters 122 and 123 of FIG. 3 are omitted. The operation is the same as that described for the circuit of FIG. 3.

Note that, in FIGS. 3 and 4, the resistors R3 and R4 may be omitted by providing larger on-resistance in MOS transistors configuring the inverters INV3 and INV4 (e.g., by providing larger gate length and smaller gate width).

Third Embodiment

Figure 5:
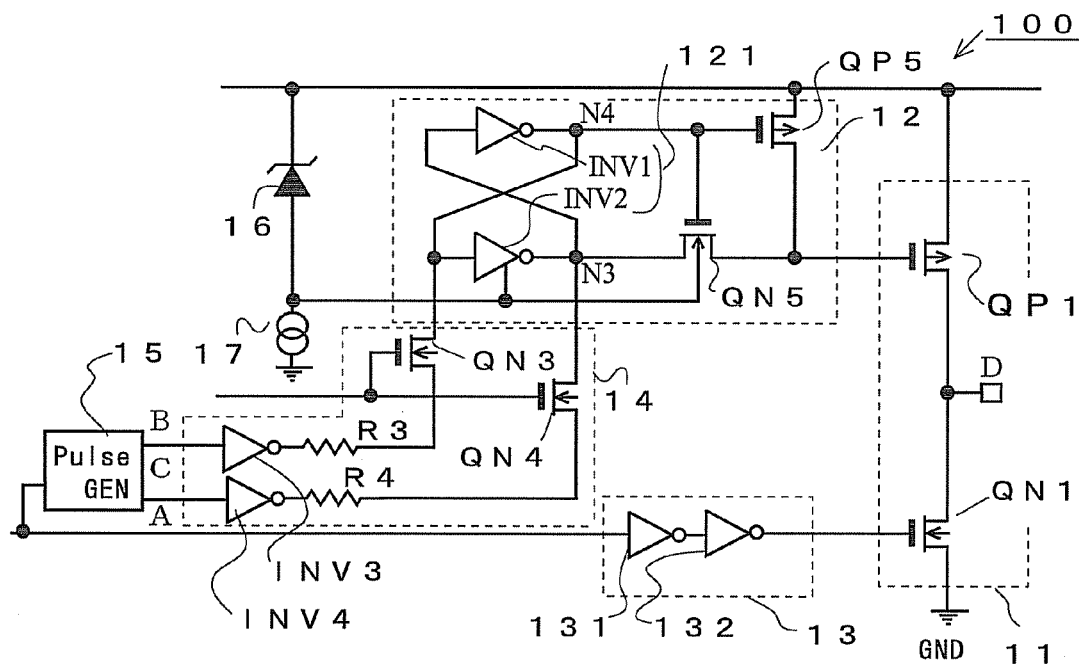
FIG. 5 is a circuit diagram illustrating a configuration of an output buffer circuit according to a third embodiment of the present invention.

Referring now to FIG. 5, description is made to a configuration of an output buffer circuit according to a third embodiment of the present invention. In FIG. 5, the same reference numerals represent the same components as the second embodiment and description thereof will be omitted.

In this embodiment, the high-side driving circuit 12 has an n-type MOS transistor QN5 connected between a data retaining node N3 in the latch circuit 121 and the gate of the pull-up transistor QP1. The gate of the n-type MOS transistor QN5 is connected to another data retaining node N4. In addition, a p-type MOS transistor QP5 is connected between the second power supply voltage (75V) and the gate of the pull-up transistor QP1. The gate of the p-type MOS transistor QP5 is connected to the data retaining node N4.

Advantages of the third embodiment will now described below in comparison to the second embodiment. In the second embodiment (the variation illustrated in FIG. 4), if an output signal D is switched from "H" to "L" (i.e., the pull-up transistor QP1 is switched from on to off), then the corresponding gate-to-source voltage in the pull-up transistor QP1 is changed from on the order of –5V to "0V". At this moment, since the voltage across the gate-to-drain parasitic capacitance in the pull-up transistor QP1 changes, a transient current flows from the pull-up transistor QP1 toward the pull-down transistor QN1.

Having the inverter INV2 with a sufficiently small on-resistance does not represent any problem when any transient current flows. Otherwise, if a large on-resistance is provided, then a gate-to-source voltage is caused in the pull-up transistor QP1 and the pull-up transistor QP1 is switched on, which results in a through current flowing in the order: second power supply voltage (75V)→pull-up transistor QP1→pull-down transistor QN1→ground voltage GND. The through current represents an increase in time for switching an output signal D. Conversely, to solve this problem, if a smaller on-resistance is provided in the inverter INV2, a larger sink current must be provided for switching that flows through the n-type MOS transistor QN4 in the level shifter 14 when an output signal D is switched from "L" to "H". Accordingly, with the configuration of the second embodiment, there is a trade-off between increase in current consumption and increase in switching rate.

In this embodiment, this problem is solved by the above-mentioned transistors QN5 and QP5.

On the one hand, when an output signal D falls from "H" to "L", the p-type MOS transistor QP5 becomes conductive and the gate of the pull-up transistor QP1 is rapidly charged to a second power supply voltage (75V). Therefore, no gate-to-source voltage is caused in the pull-up transistor QP1, the pull-up transistor QP1 does not become conductive, and hence the output signal D may rapidly fall from "H" to "L".

On the other hand, when an output signal D rises from "L" to "H", retained data in the latch circuit 121 may be changed with a small current due to the effect of the n-type MOS transistor QN5. That is, when the potential of the data retaining node N3 in the latch circuit 121 is switched from "H" to "L", there is provided a higher drain-to-source potential comparing with a back gate voltage of the n-type MOS transistor QN5 until the potential of the data retaining node N3 falls equal to or less than a threshold voltage for the inverter INV2 in the latch circuit 121. Therefore, until then, the n-type MOS transistor QN5 retains a sufficiently high on-resistance. As a result, such a setting can be provided that small current flows into the n-type MOS transistor QN4 in the level shifter 14, thereby achieving a reduction in the entire current consumption. Therefore, the third embodiment is more preferable than the second embodiment in terms that it may achieve reduction in current consumption and improvement in switching rate at the same time.

While embodiments of the present invention have been described, the present invention is not intended to be limited to the embodiments illustrated and described herein and various changes, additions or the like may be made thereto without departing from the spirit of the invention.

What is claimed is:

1. An output buffer circuit outputting an input signal output from a circuit operating at a first power supply voltage to another circuit operating at a second power supply voltage higher than the first power supply voltage, the output buffer circuit comprising:
   an output driver circuit including a pull-up transistor and a pull-down transistor connected between the second power supply voltage and a reference voltage;
   a first driving circuit outputting a first control signal to control the pull-down transistor;
   a second driving circuit including a latch circuit to latch signals, and outputting a second control signal to control the pull-up transistor based on retained data in that latch circuit; and
   a level shifter changing the retained data in the latch circuit when logic of the input signal changes,
   the level shifter comprising:
   an inverter circuit inputting a pulse signal and outputting the inverted signal; and
   an n-type MOS transistor having a drain coupled to a data retaining node in the latch circuit, a source to which an output signal from the inverter circuit is input, and a gate to which the first power supply voltage is supplied.

2. The output buffer circuit according to claim 1, wherein the second driving circuit is driven by the first power supply voltage with the second power supply voltage as a reference, and
   the first driving circuit is driven by the first power supply voltage with a ground voltage as a reference.

3. The output buffer circuit according to claim 1, further comprising:
   a pulse-signal generation circuit generating the pulse signal that rises when logic of the input signal changes.

4. The output buffer circuit according to claim 3, wherein the second driving circuit is driven by the first power supply voltage with the second power supply voltage as a reference, and
   the first driving circuit is driven by the first power supply voltage with a ground voltage as a reference.

5. The output buffer circuit according to claim 1, further comprising:
   a step-down circuit generating a third voltage resulting from reduction of the second power supply voltage by a predetermined voltage,
   wherein the second driving circuit is driven by the second power supply voltage and the third voltage.

6. The output buffer circuit according to claim 1, further comprising:
   a pulse-signal generation circuit generating a pulse signal that rises when logic of the input signal changes,
   wherein the level shifter is configured to input the pulse signal to a data retaining node in the latch circuit.

7. An output buffer circuit outputting an input signal output from a circuit operating at a first power supply voltage to another circuit operating at a second power supply voltage higher than the first power supply voltage, the output buffer circuit comprising:
   an output driver circuit including a pull-up transistor and a pull-down transistor connected between the second power supply voltage and a reference voltage;
   a first driving circuit outputting a first control signal to control the pull-down transistor;
   a second driving circuit including a latch circuit to latch signals, and outputting a second control signal to control the pull-up transistor based on retained data in that latch circuit; and
   a level shifter changing the retained data in the latch circuit when logic of the input signal changes,
   the second driving circuit comprising:
   a first conductivity type transistor forming a current path between a first data retaining node in the latch circuit and a control terminal of the pull-up transistor and having a control terminal coupled to a second data retaining node in the latch circuit; and
   a second conductivity type transistor forming a current path between the second power supply voltage and the control terminal of the pull-up transistor and having a control terminal coupled to the second data retaining node.

8. The output buffer circuit according to claim 7, wherein the second driving circuit is driven by the first power supply voltage with the second power supply voltage as a reference, and
   the first driving circuit is driven by the first power supply voltage with a ground voltage as a reference.

9. The output buffer circuit according to claim 7, wherein the level shifter comprising:
   an inverter circuit inputting a pulse signal and outputting the inverted signal; and
   an n-type MOS transistor having a drain coupled to a data retaining node in the latch circuit, a source to which an output signal from the inverter circuit is input, and a gate to which the first power supply voltage is supplied.

10. The output buffer circuit according to claim 7, further comprising:
    a pulse-signal generation circuit generating a pulse signal that rises when logic of the input signal changes.

11. The output buffer circuit according to claim 10, wherein the level shifter comprising:
    an inverter circuit inputting the pulse signal and outputting the inverted signal; and
    an n-type MOS transistor having a drain coupled to a data retaining node in the latch circuit, a source to which an output signal from the inverter circuit is input, and a gate to which the first power supply voltage is supplied.

12. The output buffer circuit according to claim 11, wherein
    the second driving circuit is driven by the first power supply voltage with the second power supply voltage as a reference; and
    the first driving circuit is driven by the first power supply voltage with a ground voltage as a reference.

13. The output buffer circuit according to claim 7, further comprising:
    a step-down circuit generating a third voltage resulting from reduction of the second power supply voltage by a predetermined voltage,
    wherein the second driving circuit is driven by the second power supply voltage and the third voltage.

* * * * *